United States Patent [19]
Latchford et al.

[11] Patent Number: 5,200,031
[45] Date of Patent: Apr. 6, 1993

[54] METHOD FOR REMOVAL OF PHOTORESIST OVER METAL WHICH ALSO REMOVES OR INACTIVATES CORROSION-FORMING MATERIALS REMAINING FROM ONE OR MORE PREVIOUS METAL ETCH STEPS

[75] Inventors: Ian S. Latchford, Cupertino, Calif.; James Dillard, Dallas, Tex.

[73] Assignee: Applied Materials, Inc., Santa Clara, Calif.

[21] Appl. No.: 749,764

[22] Filed: Aug. 26, 1991

[51] Int. Cl.$^5$ .............................................. H01L 21/00
[52] U.S. Cl. .................... 156/659.1; 156/643; 156/646; 156/668; 156/664
[58] Field of Search ............... 156/659.1, 643, 646, 156/668, 665, 664, 656

[56] References Cited

U.S. PATENT DOCUMENTS

| | | | |
|---|---|---|---|
| 4,308,089 | 12/1981 | Iida et al. | 156/659.1 |
| 4,687,544 | 8/1987 | Bersin | 156/643 |
| 4,885,047 | 12/1989 | Ury et al. | 156/668 |
| 4,919,748 | 4/1990 | Bredtenner et al. | 156/643 |

FOREIGN PATENT DOCUMENTS

| | | |
|---|---|---|
| 58-030133 | 2/1983 | Japan . |
| 63-216346 | 9/1988 | Japan . |
| 2-140923 | 5/1990 | Japan . |

OTHER PUBLICATIONS

Toy, David A., "Choose the Right Process to Strip Your Photoresist", *Semiconductor International*, Feb. 1990, pp. 82–87.

*Primary Examiner*—Brian E. Hearn
*Assistant Examiner*—George Goudreau
*Attorney, Agent, or Firm*—John P. Taylor

[57] ABSTRACT

A process is described for removing, from an integrated circuit structure, photoresist remaining after one or more metal etch steps which also removes or inactivates a sufficient amount of remaining chlorine-containing residues from the previous metal etch steps to inhibit corrosion of remaining metal for at least 24 hours. The process includes a first stripping step which comprises flowing $NH_3$ gas through a microwave plasma generator into a stripping chamber which contains the integrated circuit structure while maintaining a plasma in the plasma generator. $O_2$ gas (and optionally $NH_3$ gas) is flowed through the plasma generator into the stripping chamber during a second step while maintaining the plasma in the plasma generator.

11 Claims, 1 Drawing Sheet

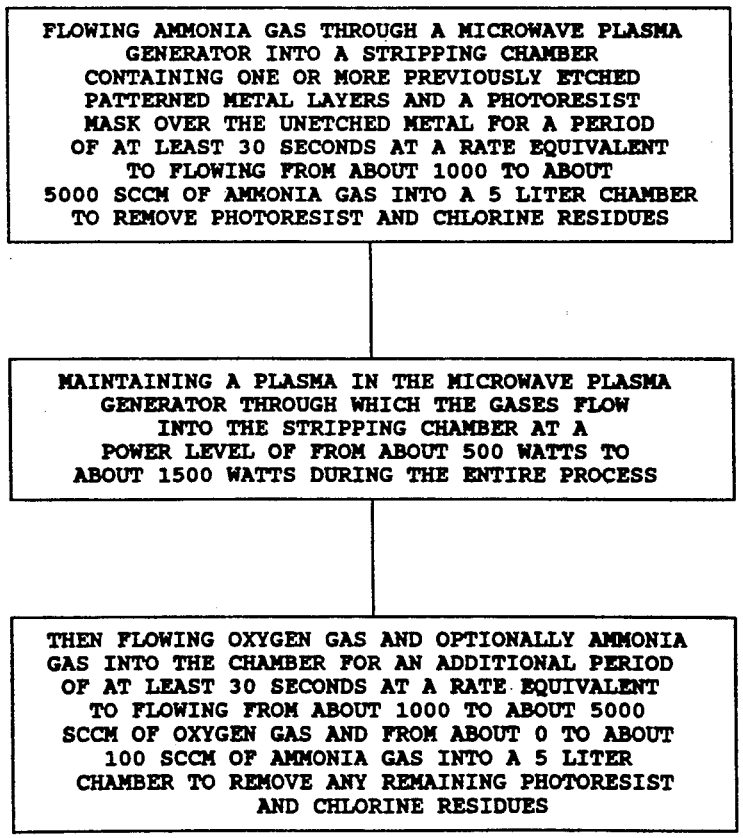

```
┌─────────────────────────────────────────────────┐
│   FLOWING AMMONIA GAS THROUGH A MICROWAVE PLASMA │
│        GENERATOR INTO A STRIPPING CHAMBER        │
│     CONTAINING ONE OR MORE PREVIOUSLY ETCHED     │
│     PATTERNED METAL LAYERS AND A PHOTORESIST     │
│     MASK OVER THE UNETCHED METAL FOR A PERIOD    │
│    OF AT LEAST 30 SECONDS AT A RATE EQUIVALENT   │
│         TO FLOWING FROM ABOUT 1000 TO ABOUT      │
│   5000 SCCM OF AMMONIA GAS INTO A 5 LITER CHAMBER│
│    TO REMOVE PHOTORESIST AND CHLORINE RESIDUES   │
└─────────────────────────────────────────────────┘
                        │
                        │
┌─────────────────────────────────────────────────┐
│    MAINTAINING A PLASMA IN THE MICROWAVE PLASMA  │
│       GENERATOR THROUGH WHICH THE GASES FLOW     │
│              INTO THE STRIPPING CHAMBER AT A     │
│           POWER LEVEL OF FROM ABOUT 500 WATTS TO │
│        ABOUT 1500 WATTS DURING THE ENTIRE PROCESS│
└─────────────────────────────────────────────────┘
                        │
                        │
┌─────────────────────────────────────────────────┐
│   THEN FLOWING OXYGEN GAS AND OPTIONALLY AMMONIA │
│    GAS INTO THE CHAMBER FOR AN ADDITIONAL PERIOD │
│     OF AT LEAST 30 SECONDS AT A RATE EQUIVALENT  │
│         TO FLOWING FROM ABOUT 1000 TO ABOUT 5000 │
│      SCCM OF OXYGEN GAS AND FROM ABOUT 0 TO ABOUT│
│           100 SCCM OF AMMONIA GAS INTO A 5 LITER │
│     CHAMBER TO REMOVE ANY REMAINING PHOTORESIST  │
│                   AND CHLORINE RESIDUES          │
└─────────────────────────────────────────────────┘
```

METHOD FOR REMOVAL OF PHOTORESIST OVER METAL WHICH ALSO REMOVES OR INACTIVATES CORROSION-FORMING MATERIALS REMAINING FROM ONE OR MORE PREVIOUS METAL ETCH STEPS

BACKGROUND OF THE INVENTION

1. Field of the Invention

This invention relates to a process for removing photoresist remaining over one or more metal layers after etching of such metal layers. More particularly, this invention relates to a dry process for removing photoresist and also removing or inactivating corrosion-forming etch residues remaining over one or more metal layers after etching of the metal layers.

2. Description of the Related Art

A photoresist mask, which remains over portions of one or more metal layers on an integrated circuit structure after patterning such metal layers through the photoresist mask, has been conventionally removed by dry etch techniques using plasmas of oxygen and fluorocarbon gases. Such dry etch techniques are preferred over wet etch techniques since underlying metals are not attacked, and because the dry etching is sometimes more effective in removal of photoresist residues, particularly when the photoresist has been altered by reactive ion etching, high temperature post bakes, or the like.

However, such dry etch techniques have been found to be less than satisfactory in removing or inactivating certain sidewall etch residues remaining from the previous metal etch (patterning) step. Such metal etch processes conventionally use chlorine-based chemistry, e.g., $Cl_2$ and $BCl_2$, which may leave chlorine-containing sidewall residues on the sidewalls of the photoresist mask and underlying metal layer portions after the metal etch.

In this regard, a particular problem exists when etching a titanium-tungsten layer, which may be utilized under an aluminum layer to prevent spiking of the aluminum to an underlying silicon layer. This is because tungsten etch products, such as tungsten chloride, are not as volatile as titanium chloride or aluminum chloride and, therefore, tend to remain on the surfaces of the integrated circuit structure. This apparently occurs even though it is common to use a fluorocarbon metal etch to etch the titanium-tungsten metal layer, after a chlorine etch is used to etch the overlying metal such as aluminum, and such a fluorocarbon etch will remove some of the undesirable chlorine etch products.

If chlorine-containing residues (regardless of their source) in the sidewall residues, remaining after the metal etch step, are not removed or inactivated during the subsequent removal of the photoresist mask, such chlorine-containing residues may cause corrosion of the underlying metal or metals prior to subsequent downstream processing steps which may include washing (solvent-rinse) steps resulting in removal of such chlorine-containing residues.

Since it is known that such subsequent processing steps can result in removal of any chlorine-containing residues remaining in sidewalls from the metal etch step, it has become conventional to judge the effectiveness of the photoresist removal step in also removing or inactivating such chlorine-containing residues based on how much corrosion occurs during a 24 hour period following the photoresist removal step. If no corrosion of the underlying metal or metals occurs within 24 hours after the photoresist removal step, the photoresist removal step is judged to have successfully removed or inactivated a sufficient amount of such corrosion-causing residues, since it is assumed that within 24 hours the integrated circuit structure will have been subjected to subsequent processing which will include at least one subsequent washing step which will remove any remaining chlorine-containing residues.

However, the currently practiced photoresist removal process using $O_2$ and $CF_4$, has not succeeded in providing this desired 24 hours of protection from corrosion of the metal or metals by such chlorine-containing residues.

It would, therefore, be desirable to provide an improved process for the removal of photoresist remaining after a metal etch step which would not only remove the photoresist mask, but also remove or inactivate a sufficient amount of any remaining chlorine-containing residues from the metal etching step so that the remaining metal or metals will be passivated or free from corrosion for at least 24 hours after such processing.

SUMMARY OF THE INVENTION

The invention comprises a process for removing photoresist remaining after a metal etch, which also removes or inactivates a sufficient amount of any remaining chlorine-containing residues, in sidewalls residues remaining from the metal etch step, to inhibit corrosion of the remaining metal or metals for at least 24 hours. The process includes a reducing step using $NH_3$ associated with a plasma followed by a subsequent stripping step using either $O_2$, or a combination of $O_2$ and $NH_3$ gases, and associated with a plasma.

BRIEF DESCRIPTION OF THE DRAWING

The sole figure is a flow sheet illustrating the process of the invention.

DETAILED DESCRIPTION OF THE INVENTION

The process of the invention is utilized on an integrated circuit structure whereon a metal layer, or a composite of metal layers, previously deposited on an integrated circuit structure, and which, for example, may comprise a titanium-tungsten barrier layer and an overlying aluminum layer, has just been etched through a photoresist mask, leaving titanium-tungsten barrier metal portions and aluminum portions under the photoresist mask. After the metal etch step, sidewall etch residues remain on the sidewall surfaces of the photoresist mask, and on the sidewall surfaces of the remaining underlying metal layer portions. These sidewall etch residues, in turn, contain chlorine etch materials or residues therein which can cause corrosion of such metal portions.

In accordance with the invention, the chlorine-containing residues in such sidewalls are removed or inactivated and remaining metal portions of the metal layers are passivated during the process for the removal of the photoresist mask portions.

The metal layer, or metal layers, partially removed during the preceding metal etch step to leave the patterned metal portions, may comprise any metal conventionally used in the formation of integrated circuit structures, such as, for example, aluminum, titanium, tungsten, etc. When multiple metal layers are etched to form metal portions, the upper metal portions will usually comprise aluminum and the underlying metal portions will usually comprise metal compounds such as titanium nitride or titanium tungsten which serve as a barrier layer to prevent spiking of aluminum to underlying silicon contacts. Such underlying electrically conductive metal-containing barrier materials will be referred to herein as metal layers, regardless of whether they comprise pure metals, metal alloys, or metal compounds.

The process of the invention finds greatest utility when the underlying metal barrier portions comprise titanium tungsten and the upper metal portions comprise aluminum, or any other metal which may be subject to corrosion by chlorine-containing residues, or other corrosion-forming metal etch step residues, in the remaining sidewalls, if such residues in such sidewalls are not removed during the photoresist removal step. By aluminum is meant either pure aluminum or an aluminum alloy such as, for example, an aluminum alloy containing 1-2 wt. % silicon and 0 to 4 wt. % copper.

The integrated circuit structure (wafer) is removed from the metal etch chamber and placed in a vacuum stripping chamber, unless the same chamber is to be used for both processes. The stripper chamber is maintained at a pressure ranging from about 0.5 to about 3 Torr, typically about 2 Torr.

The temperature of the wafer, as it emerges from the metal etch chamber, is usually about 100° C. The wafer temperature, during the stripping process is maintained within a range of from about 100° C. to about 400° C., preferably from about 200° C. to about 300° C., and typically about 245° C. When a temperature higher than the incoming wafer temperature of 100° C. is to be used for the wafer temperature during the stripping process of the invention, the wafer temperature may be ramped up to the desired temperature at a rate of about 10° C. per second while the first stripping step is being carried out.

During the first stripping step, $NH_3$ gas is flowed into the stripping chamber at a rate equivalent to a rate of from about 1000 to about 5000 standard cubic centimeters per minute (sccm), typically about 3000 sccm, into a 5 liter chamber.

A plasma having a power level of from about 500 watts to about 1500 watts, preferably from about 1200 watts to about 1500 watts, and typically about 1400 watts, is ignited in the $NH_3$ flow, preferably upstream of the stripping chamber, when the $NH_3$ gas flow commences, and this plasma is maintained during the entire process.

While any type of conventionally generated plasma may, in general, be used in the practice of the invention, preferably the plasma used in the process of the invention is generated by a microwave plasma generator such as, for example, a Model AURA plasma generator commercially available from the GaSonic division of Atomel Corporation of Sunnyvale, Calif., which is located upstream of the stripping chamber.

In this type of apparatus, the gas flowing toward the stripping chamber first passes through the microwave plasma generator located upstream of the stripping chamber and the plasma generated therein produces reactive species from the gases flowing through the plasma generator to the stripping chamber, and such reactive species then flow into the stripping chamber.

The first step of the process of the invention is carried out for a period of at least about 30 seconds up to about 5 minutes. Longer time periods can be used, if desired, although such longer time periods are not deemed necessary and may be uneconomical by lowering throughput.

If desired, the flow of ammonia, through the plasma generator into the stripping chamber, may be optionally accompanied by a flow of inert or non-reactive gas such as, for example, nitrogen, argon, or helium as a carrier gas, a passivation agent, or to permit the use of higher temperature plasmas.

While we do not wish to be bound by any theories of operation, it is believed that the use of ammonia, without oxygen, at this stage permits reduction of any metal chloride residues, and in particular tungsten chloride residues (if such are present) in the sidewall residues on the side surfaces of the photoresist mask or underlying metal portions. Such reduced compounds may then be more easily removed from the integrated circuit structure or at least inactivated to inhibit corrosion of the remaining metal portions on the structure.

Following the first stripping stage, the integrated circuit structure is further treated by optionally continuing to flow $NH_3$ gas through the plasma generator into the stripper chamber, while maintaining the plasma in the generator, and, in addition, flowing a source of $O_2$ through the plasma generator into the stripping chamber. The source of $O_2$ is flowed into the chamber at an equivalent rate within the range of from about 1000 to about 5000 sccm, typically about 3000 sccm flowing into a 5 liter stripping chamber.

The $O_2$ and $NH_3$ gases are flowed through the plasma generator into the chamber for a period of at least about 30 seconds up to a period of about 5 minutes. As discussed about, longer periods may be used, but are not deemed to be unnecessary.

It should be noted that in this second stage, the flow of $NH_3$ into the stripping chamber is optional. Thus the equivalent flow of $NH_3$ into the stripping chamber may range from 0 to about 100 sccm, but typically will be about 65 sccm.

The stripping chamber pressure and the wafer temperature during the second stripping step may remain the same as during the first stripping step.

After expiration of the desired stripping time for the second stripping step, the plasma is then extinguished and the flow of $O_2$ gas, or $NH_3$ and $O_2$ gases (when $NH_3$ is also used), is shut off. The wafer may be removed from the stripping chamber and subject to further processing, e.g., topside processing, as desired. The process of the invention removes all of the photoresist and also removes or inactivates a sufficient amount of any chlorine-containing residues remaining from prior metal etching to provide freedom from any corrosion for at least 24 hours following the resist removal process of the invention.

To further illustrate the invention, a silicon wafer was provided with a layer of oxide thereon, a layer of titanium-tungsten was deposited over the oxide layer, a layer of aluminum containing 1 wt. % silicon and 0.5 wt. % copper was deposited over the titanium-tungsten layer, and a photoresist mask was then formed over the metal layers. The metal layers were first conventionally etched through the photoresist mask using a mixture of $BCl_3$ and $Cl_2$ etchant gases to etch the aluminum layer, followed by a mixture of $CF_4$ and $SF_6$ gases to etch the titanium-tungsten layer, in a 11.5 liter vacuum etch chamber.

The wafer, which reached a temperature of about 100° C. in the metal etch chamber, was placed in a 5 liter stripping chamber where the photoresist mask was then stripped and the remaining underlying metal portions passivated by removal or inactivation of any chlorine residues remaining in the sidewalls from the metal etch steps. The temperature of the wafer was ramped, at a rate of about 10° C. per second, up to about 245° C., as measured by an optical pyrometer, while flowing NH$_3$ through a microwave plasma generator into the stripping chamber at a rate of about 3000 sccm. At the same time, a plasma was ignited in the plasma generator and maintained at a power level of about 1400 watts. This first step was carried out for a period of about 60 seconds.

The flow of NH$_3$ gas was then reduced to about 65 sccm and, without extinguishing the plasma, O$_2$ was also flowed through the plasma generator into the stripping chamber at a rate of about 3000 sccm for an additional period of about 60 seconds. The flow of O$_2$ and NH$_3$ gases were then shut off and the plasma was extinguished.

The stripped wafer was allowed to cool to room temperature, after which the wafer was removed from the stripping chamber and allowed to stand in the open atmosphere for 24 hours. The wafer surface was then examined, using 500×light field and dark field optical microscopes, and a 50,000×scanning electron microscope (SEM). All of the photoresist was removed and no evidence of corrosion was found on the exposed metal surfaces.

Thus, the process of the invention results in complete removal of photoresist from the surface of an integrated circuit structure after patterning of one or more metal layers beneath the resist mask and remaining metal is passivated by removal or inactivation of any corrosion-producing chlorine-containing residues remaining from the prior metal etch step or steps.

Having thus described the invention what is claimed is:

1. A dry process for removing, from an integrated circuit structure, photoresist remaining after one or more metal etch steps which process also removes or sufficiently inactivates chlorine-containing etch residues remaining from said previous one or more metal etch steps to provide at least 24 hours resistance to corrosion prior to removal of said inactivated chlorine-containing etch residues by wet processing, which dry process comprises:
   a) flowing, into a vacuum stripping chamber maintained at a pressure of from about 0.5 Torr to about 3 Torr and containing said integrated circuit structure, NH$_3$ gas for a period of at least about 30 seconds at a rate equivalent to flowing from about 1000 sccm to about 5000 sccm of said NH$_3$ gas into a 5 liter chamber;
   b) maintaining a plasma associated with said vacuum stripping chamber while said NH$_3$ gas is flowing into said stripping chamber;
   c) then flowing NH$_3$ and O$_2$ gases into said vacuum chamber at a rate equivalent to a flow of from about 0 sccm to about 100 sccm of NH$_3$ and from about 1000 sccm to about 5000 sccm of O$_2$ into a 5 liter chamber for an additional period of at least about 30 seconds;

to thereby remove sad photoresist and also remove or sufficiently inactivate said chlorine-containing residues to provide said 24 hors of corrosion protection prior to wet processing to remove any remaining chlorine-containing residues.

2. The process of claim 1 wherein said plasma is maintained at a power level of from about 1200 watts to about 1500 watts during said process.

3. The process of claim 2 wherein said plasma is generated in a microwave plasma generator upstream of said stripping chamber and said gases flow through said plasma generator before entering said stripping chamber.

4. The process of claim 3 wherein said wafer is maintained at a temperature of from about 100° C. to about 400° C. during said process.

5. A dry process for removing, from an integrated circuit structure in a vacuum stripping chamber, photoresist remaining after a metal etch, which process also removes or inactivates chlorine-containing etch residues remaining from said previous metal etch, comprising:
   a) flowing through a microwave plasma generator, into said vacuum stripping chamber containing said integrated circuit structure, NH$_3$ gas for a period of at least about 30 seconds at a rate equivalent to flowing from about 1000 sccm to about 5000 sccm of said NH$_3$ gas into a 5 liter chamber;
   b) maintaining said integrated circuit structure within said vacuum stripping chamber at a temperature of from about 100° C. to about 400° C. during said process;
   c) maintaining said plasma in said microwave plasma generator during said process at a power level of from about 1200 watts to about 1500 watts;
   d) then flowing NH$_3$ and O$_2$ gases through said plasma generator into said vacuum chamber at a rate equivalent to a flow of from about 0 sccm to about 100 sccm of NH$_3$ and from about 1000 sccm to about 5000 sccm of O$_2$ into a 5 liter chamber for an additional time period of at least about 30 seconds;

to thereby remove said photoresist and also remove or sufficiently inactivate said chlorine-containing residues to provide corrosion protection prior to subsequent wet processing within 24 hours to remove any remaining chlorine-containing residues.

6. The process of claim 5 wherein said wafer is maintained at a temperature of from about 200° C. to about 300° C. during said process.

7. A dry process for removing from an integrated circuit structure on a semiconductor wafer maintained at a temperature of from about 100° C. to about 400° C., in a vacuum, stripping chamber, photoresist remaining after one or more metal etch steps with a chlorine-containing etchant, including an aluminum etch step, which process also removes or inactivates chlorine-containing etch residues remaining from said previous aluminum etch to provide up to 24 hours of protection from corrosion prior to subsequent wet processing to remove any remaining chlorine-containing residues which comprises:
   a) flowing NH$_3$ gas into said vacuum stripping chamber at a rate equivalent to a flow of from about 1000 sccm to about 5000 sccm into a 5 liter chamber to expose said structure to NH$_3$ for a period of at least about 30 seconds while maintaining a plasma in said stripping chamber maintained at a power level of from about 500 to about 1500 watts, and generated in a microwave plasma generator upstream of said vacuum stripping chamber;

b) shutting off the flow of $NH_3$ into said chamber; and c) then flowing $O_2$ gas into said vacuum stripping chamber at a rate equivalent to a flow of from about 1000 sccm to about 5000 sccm into a 5 liter chamber to expose said structure to $O_2$ gas for a period of at least about 30 seconds while maintaining said plasma in said stripping chamber;

whereby said photoresist will be removed and said chlorine-containing etch residues will be removed or sufficiently inactivated to provide at least 24 hours resistance to corrosion by remaining aluminum portions on said integrated circuit structure to thereby permit a time interval of up to 24 hours prior to removal of any remaining chlorine-containing residues by wet processing of said wafer.

8. The process of claim 7 wherein said wafer is maintained at a temperature of from about 200° C. to about 300° C. during said process.

9. The process of claim 7 wherein said wafer is heated to said temperature range at a rate of about 10° C. per second.

10. The process of claim 7 wherein said stripping chamber is maintained at a pressure of from about 0.5 Torr to about 3 Torr during said process.

11. The process of claim 7 wherein said one or more metal etch steps further comprise the etching of a titanium-tungsten layer with said chlorine-containing etchant resulting in the formation of low volatility tungsten chloride residues which are not removed during said one or more metal etch steps, and said process removes or inactivates said low volatility tungsten chloride residues.

* * * * *